(12) United States Patent
McKeeby et al.

(10) Patent No.: US 10,849,222 B2
(45) Date of Patent: Nov. 24, 2020

(54) HIGH TEMPERATURE RESISTANT FABRIC AND ITS USE IN FLEXIBLE CIRCUITS

(71) Applicant: PIONEER CIRCUITS, INC., Santa Ana, CA (US)

(72) Inventors: Dale McKeeby, Orange, CA (US); Robert Lee, Newport Beach, CA (US)

(73) Assignee: PIONEER CIRCUITS, INC., Santa Ana, CA (US)

( * ) Notice: Subject to any disclaimer, the term of this patent is extended or adjusted under 35 U.S.C. 154(b) by 0 days.

(21) Appl. No.: 15/812,874

(22) Filed: Nov. 14, 2017

(65) Prior Publication Data
US 2018/0199434 A1    Jul. 12, 2018

Related U.S. Application Data

(60) Provisional application No. 62/421,915, filed on Nov. 14, 2016.

(51) Int. Cl.
| | |
|---|---|
| H05K 1/03 | (2006.01) |
| H05K 1/02 | (2006.01) |
| H05K 3/46 | (2006.01) |
| H05K 1/09 | (2006.01) |
| H05K 3/28 | (2006.01) |

(52) U.S. Cl.
CPC .......... *H05K 1/038* (2013.01); *H05K 1/0201* (2013.01); *H05K 1/0393* (2013.01); *H05K 1/09* (2013.01); *H05K 3/285* (2013.01); *H05K 3/4655* (2013.01); *H05K 1/0281* (2013.01); *H05K 1/0366* (2013.01); *H05K 2201/012* (2013.01); *H05K 2201/0154* (2013.01); *H05K 2201/0195* (2013.01); *H05K 2201/029* (2013.01); *H05K 2201/09027* (2013.01); *H05K 2203/0108* (2013.01); *H05K 2203/0113* (2013.01)

(58) Field of Classification Search
CPC .... H05K 1/083; H05K 1/0201; H05K 1/0393; H05K 1/09; H05K 1/0281; H05K 1/118; H05K 1/05; H05K 1/053; H05K 1/056; H05K 1/0366; H05K 1/0353; H05K 1/0271; H05K 1/0278; H05K 2201/029
See application file for complete search history.

(56) References Cited

U.S. PATENT DOCUMENTS

| | | | | |
|---|---|---|---|---|
| 4,851,613 A | * | 7/1989 | Jacques | H05K 1/028 174/254 |
| 4,883,708 A | * | 11/1989 | Kariya | B32B 15/08 442/198 |
| 5,783,039 A | * | 7/1998 | Murayama | D04H 1/60 174/255 |
| 7,758,964 B2 | | 7/2010 | Lu et al. | |

(Continued)

*Primary Examiner* — Roshn K Varghese
(74) *Attorney, Agent, or Firm* — One LLP; Joseph K. Liu

(57) ABSTRACT

Provided herein are embodiments of a PWB circuit construction material, and its use in flexible PWB circuits. The PWB circuit construction material is made up of temperature resistant fabric bonded to a metal substrate using a bonding agent. The temperature resistant material may include synthetic aromatic polyamide fibers. The fabric may be used as a reinforcement for the standard PWB construction materials for flexible PWB circuits and as a standalone piece that is bonded as a hinge at rigid portions of a rigid or rigid-flexible PWB circuit to reduce the thermal effects.

3 Claims, 19 Drawing Sheets

(56) References Cited

U.S. PATENT DOCUMENTS

| | | | |
|---|---|---|---|
| 2001/0023780 A1* | 9/2001 | Mori | H05K 1/0271 174/255 |
| 2003/0082363 A1* | 5/2003 | Nakagiri | B32B 5/26 428/313.3 |
| 2008/0210458 A1* | 9/2008 | Yamashita | H05K 3/20 174/255 |

* cited by examiner

| Sample | | Yield % | Thickness (in) | Air Permeability % | Dry Tensile % | Filler Loading % | MD % | CD % | Pattern |
|---|---|---|---|---|---|---|---|---|---|
| HT002 | | 2.8% | .0063 | 173.3% | 207% | 201% | 56% | 53% | Plain |
| HT003 | | 3.6% | .0070 | 25.7% | 162% | 154% | 67% | 63% | Plain |
| HT004 | | 3.3% | .0065 | 42.2% | 168% | 156% | 64% | 66% | Plain |
| HT005 | | 2.90% | .0066 | 143.7% | 224% | 212% | 55% | 53% | Plain |
| HT006 | | 2.5% | .0065 | 383.5% | 115% | 110% | 45% | 45% | Plain |
| HT010 | | 6.3% | .0145 | 24.1% | 477% | 402% | 62% | 46% | Plain |
| HT016 | | 3.4% | .0072 | 62.4% | 151% | 151% | 65% | 63% | Plain |

FIG. 2C

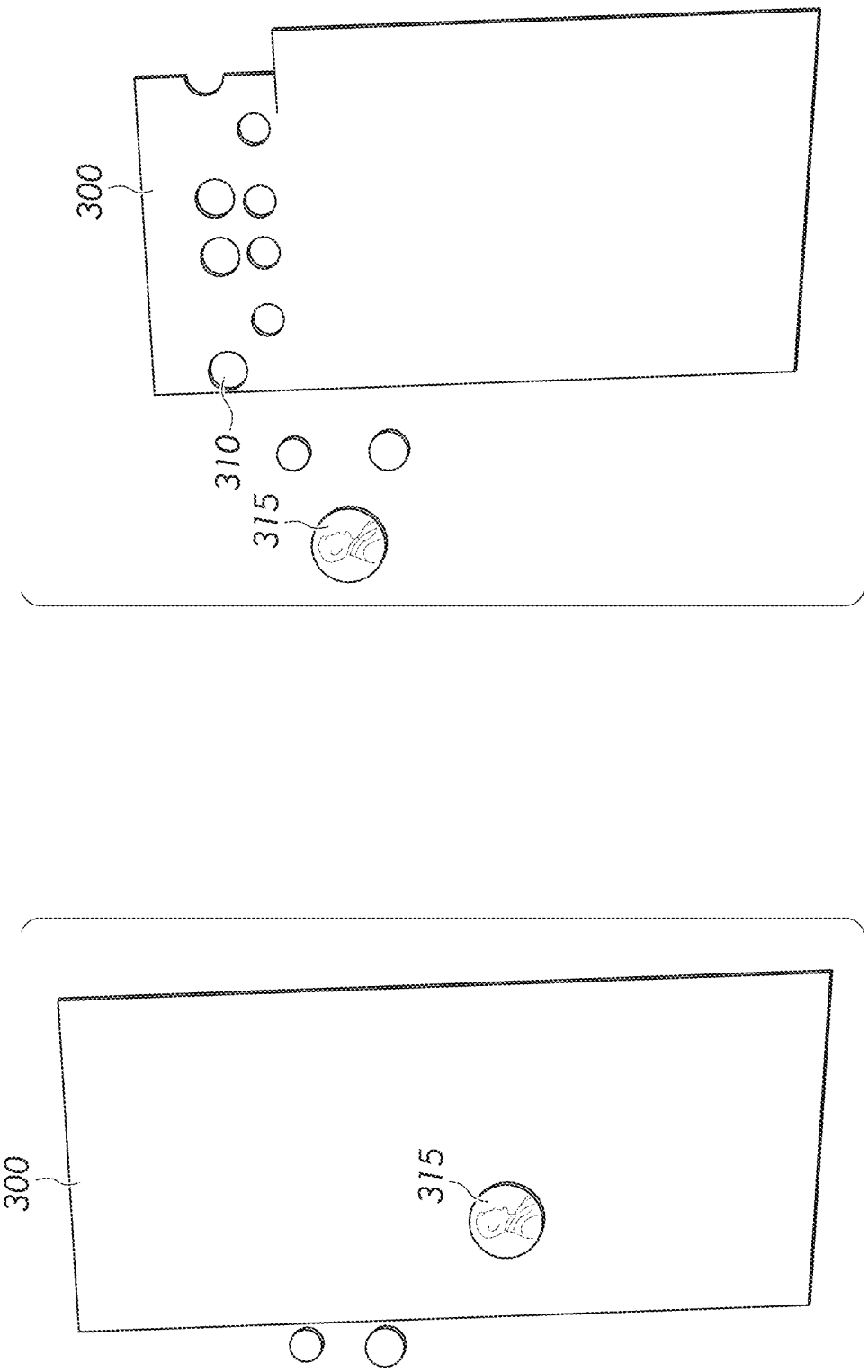

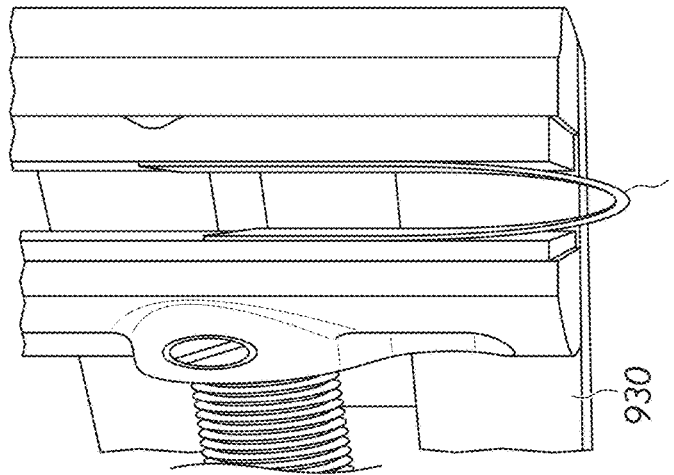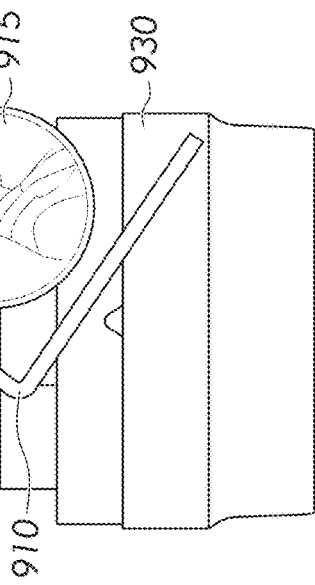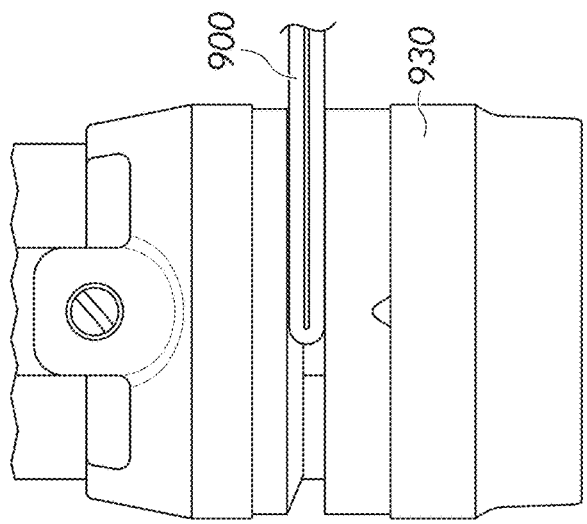

HIGH TEMPERATURE RESISTANT FABRIC AND ITS USE IN FLEXIBLE CIRCUITS

CROSS-REFERENCE TO RELATED APPLICATIONS

The present application claims priority to U.S. Provisional Application No. 62/421,915 filed on Nov. 14, 2017, which is incorporated herein by reference in its entirety.

TECHNICAL FIELD

The claimed invention relates to high temperature resistant fabric, and more specifically, to flexible printed wiring board ("PWB") circuit materials reinforced with high temperature resistant fabric and systems and methods of using it in reinforcing flexible PWB circuits.

BACKGROUND OF THE INVENTION

In the engineering stage of complex designs and while conceiving the first proto-type, drawings generally go through multiple reviews and changes. This process is called "revision evolution" since the final design and prototype is evolved after multiple revisions. Revision evolution is quite normal for complex designs that exceed both the manufacturers' capability and those which do not meet the final required specifications.

Standard PWB circuit materials, such as Kapton or LG 1000/2000, used in construction for multilayer rigid-flexible and flexible PWB circuits have susceptibility and limited resistance to mechanical forces and mechanical abrasions that can limit their application and shorten their expected lifecycle. Many PWB circuit constructions used in the industry cannot take a sharp bend radius without failing by either cracking or delaminating. Furthermore, standard flexible and semi-flexible PWB circuit construction materials used for rigid-flexible and flexible PWB circuits are susceptible to taking on a permanent radial bend set. This susceptibility is particularly concerning when dynamic-flexible movement is required. Even the use of different standard PWB circuit construction materials with different mechanical properties to construct rigid-flexible PWB circuits does not prevent the PWB circuits from being easily torn at the egress of the flexible-rigid section and/or at any points of sharp radii in the rigid-flexible PWB circuits. Accordingly, the available design options for the PWB circuits is limited.

If no other viable design options are conceived for the PWB circuits, the whole project, of which the PWB circuit is merely a component, may simply be abandoned or postponed. In such cases, the non-viable design for a rigid-flexible or flexible PWB circuit is sent back to the drawing board because the PWB circuit design, as proposed, cannot survive the environment or function for which it was built. Unfortunately, the non-viability of the PWB circuits is generally hard to notice until it is too late and the PWB circuit fails while in use or during its first qualification testing. At that point, monetary and systemic loss, such as requiring a complete upheaval of the PWB circuit, occurs. This loss is particularly pronounced in the military and aerospace industry.

Currently, only methods to reinforce a standard PWB circuit construction material at critical points, which may tear, break, delaminate, or suffer from mechanical failure, are available. Furthermore, such methods to reinforce critical points of a standard PWB circuit construction material use standard woven glass and/or acrylic anti-stress tabs. Such tabs are applied to lessen various mechanical failures. Other methods to reinforce the critical points of a standard PWB circuit construction material and to solve other inherent problems, such as the radial set condition, associated with the use of standard PWB circuit construction materials include expensive methods such as fixtures and specialized tooling. Some examples of fixtures and specialized tooling include hold-down (bolt-in-place) fixtures that hold the flexible PWB circuits through G-force accelerations or vibrations and other special production lines that are employed for higher volume assemblies. While such inherent problems cannot be solved completely using fixtures and specialized tooling, no other way to solve this problem was available till now. In many cases, the only solution was to completely re-engineer the PWB circuit part with the problem. Consequently, the next assembly level would also require a change to accommodate the new PWB circuit configuration. Therefore, the inherent problems associated with the use of standard PWB circuit construction materials have an immense economical and ripple potential.

Accordingly, it is desirable to provide a novel, efficient, and strong PWB circuit construction material that can withstand various mechanical forces and temperature variations exerted on it and not break, tear, delaminate, or exhibit the weak mechanical properties of standard PWB circuit construction materials. The high temperature fabric reinforcement, as described herein, eliminates or greatly decreases the expensive revision evolution process and solves many of the inherent problems associated with standard PWB circuit construction materials.

SUMMARY OF THE INVENTION

Provided herein are embodiments of a PWB circuit construction material, and its use in flexible PWB circuits. The PWB circuit construction material is made up of temperature resistant material bonded to a metal substrate. The temperature resistant material may include synthetic aromatic polyamide fibers. The fabric may be used as a reinforcement for the standard PWB construction materials for flexible PWB circuits and as a standalone piece that is bonded as a hinge at rigid portions of a rigid or rigid-flexible PWB circuit to reduce the thermal effects. All embodiments are capable of handling high temperature.

Other features and advantages of the present invention will be or will become apparent to one skilled in the art upon examination of the following figures and detailed description, which illustrate, by way of examples, the principles of the present invention.

BRIEF DESCRIPTION OF THE DRAWINGS

The present invention may be better understood by referring to the following figures. The components in the figures are not necessarily to scale, emphasis instead being placed upon illustrating the principles of the disclosure. In the figures, reference numerals designate corresponding parts throughout the different views.

FIG. 2C illustrate some examples of NOMEX high temperature non-glass woven fabrics that may be used in exemplary embodiments of the present invention.

FIGS. 3A and 3B illustrate the results of a die punching test conducted on an exemplary reinforced PWB circuit construction material according to exemplary embodiments of the present invention.

FIGS. 9A-9I illustrate the before and after results of severe compression testing on a reinforced PWB circuit construction material according to exemplary embodiments of the present invention.

DETAILED DESCRIPTION

Figure 1B:
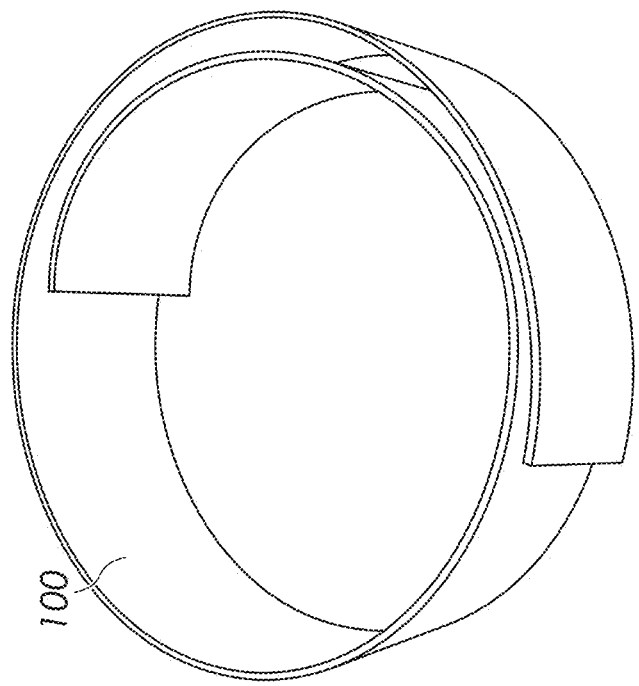
FIGS. 1A and 1B illustrate the result of a construction test involving a four-layer standard PWB circuit construction material.

The below described figures illustrate the described invention and method of use in at least one of its preferred, best mode embodiment, which is further defined in detail in the following description. Those having ordinary skill in the art may be able to make alterations and modifications to what is described herein without departing from its spirit and scope. While this invention is susceptible to different embodiments in different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated. All features, elements, components, functions, and steps described with respect to any embodiment provided herein are intended to be freely combinable and substitutable with those from any other embodiment unless otherwise stated. Therefore, what is illustrated is set forth only for the purposes of example and should not be taken as a limitation on the scope of the present invention.

In the following description and in the figures, like elements are identified with like reference numerals. The use of "e.g.," "etc.," and "or" indicates non-exclusive alternatives without limitation, unless otherwise noted. The use of "including" or "includes" means "including, but not limited to," or "includes, but not limited to," unless otherwise noted.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B", when used in conjunction with open-ended language such as "comprising" can refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

Provided herein are embodiments of a PWB circuit construction material, and its use in flexible PWB circuits. The construction material is made up of a standard PWB circuit construction material reinforced with either a completely non-glass woven fabric or a mixture of glass and non-glass woven fabric, both consisting of synthetic aromatic polyamide fibers. The construction material may also be made up non-woven fabric. The fabric may be used as a reinforcement that is bonded to the standard PWB circuit construction materials for flexible PWB circuits or as a standalone piece that is bonded as a hinge at rigid portions of a rigid or rigid-flexible PWB circuit to reduce the thermal effects. All embodiments are high temperature resistant.

Figure 1A:
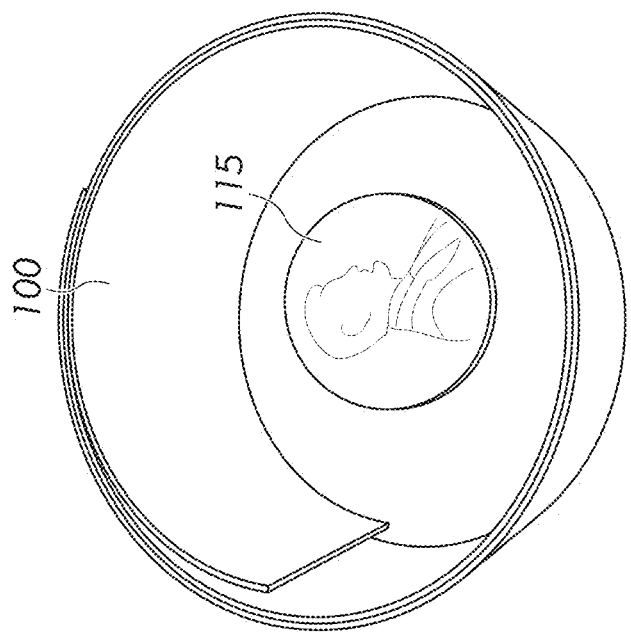

Turning to the figures, FIGS. 1A and 1B illustrate the result of a construction test involving a four-layer standard PWB circuit construction material 100. A common issue facing engineers using flexible circuits in a dynamic radial application is that the coiled flexible circuitry tends to take a radial set overtime. This is especially true if the application, for which the flexible circuit is being used, is exposed to temperature excursions while the flexible circuit is held in a tight coil over a long period. FIG. 1A illustrates the standard four-layer PWB circuit construction material 100 coiled at a one-inch (2.54 cm) radius. Coin 115 is shown for scale. FIG. 1B illustrates the standard four-layer PWB circuit construction material 100 after being coiled at a one-inch (2.54 cm) radius for one hour at room temperature. The standard four-layer PWB circuit construction material 100 was then unbound and allowed to relax in an unrestrained position. However, as shown in FIG. 1B, the standard four-layer PWB circuit construction material 110 had already gone into a radial set condition within that short duration of being tightly wound. Radial set is a condition that prevents the standard PWB circuit material 100 from springing back to its uncoiled state after being in a coiled state for a while, even after being allowed to uncoil in an unrestrained manner. This is a common issue that engineers must face when the application, in which a PWB circuit is being used, requires a tight radial bend of the flexible circuits held in that position over a long period while exposed to varying thermal cycles. For example, space vehicles, such as the ones used in Mars robotic missions, are typically subject to thermo-excursions during the decontamination process, and the use of standard PWB circuit construction materials, such as the standard four-layer PWB circuit construction material 100, can result in malfunctioning of the standard PWB circuit in the space vehicles. The beginning and ending radii illustrated in FIGS. 1A and 1B are exemplary and are not exhaustive results of all construction tests. The results of the construction test vary depending on various factors such as the thickness of the standard four-layer PWB circuit construction material 100, the temperature of the surroundings, duration for which the standard four-layer PWB circuit construction material 100 was held in coiled position, etc.

Figure 2A:
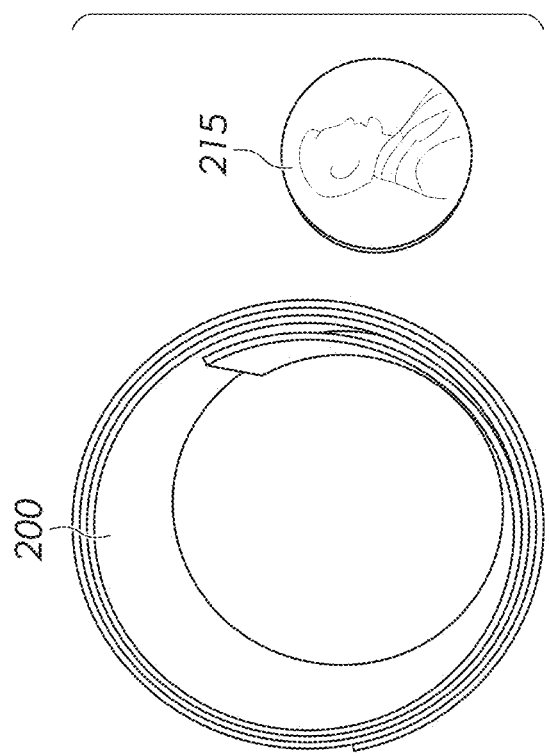
FIGS. 2A and 2B illustrate the results of a construction test involving a reinforced PWB circuit construction material according to exemplary embodiments of the present invention.
Figure 2B:
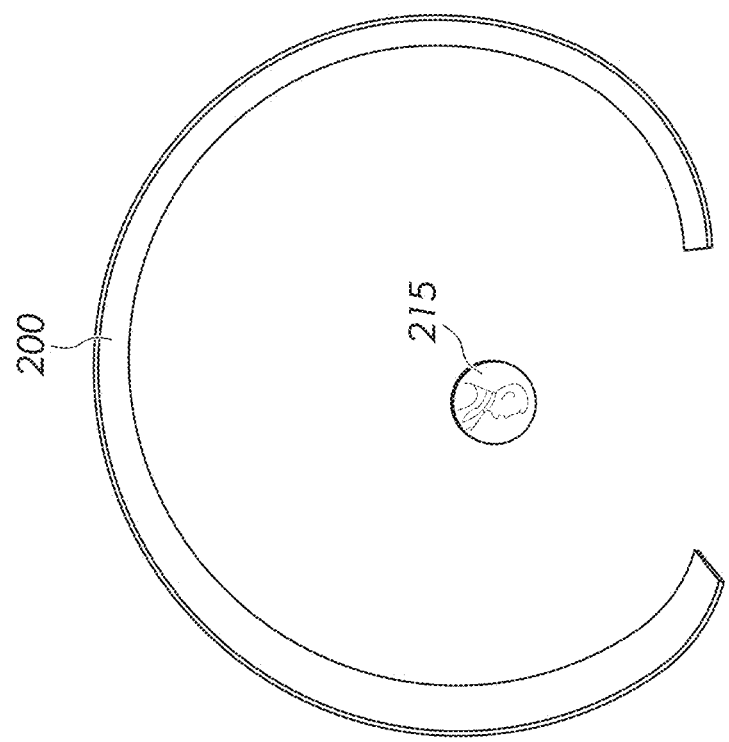
Figure 4A:
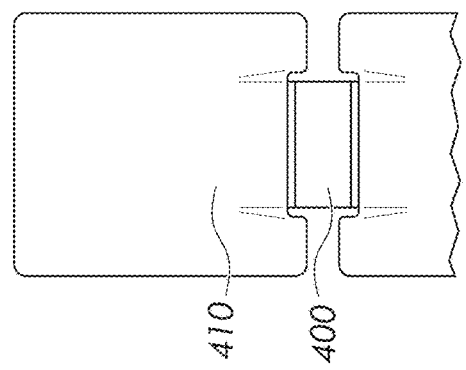
FIGS. 4A-4D illustrate the results of a successful fillet replacement testing conducted on a reinforced PWB circuit construction material according to exemplary embodiments of the present invention.
Figure 4B:
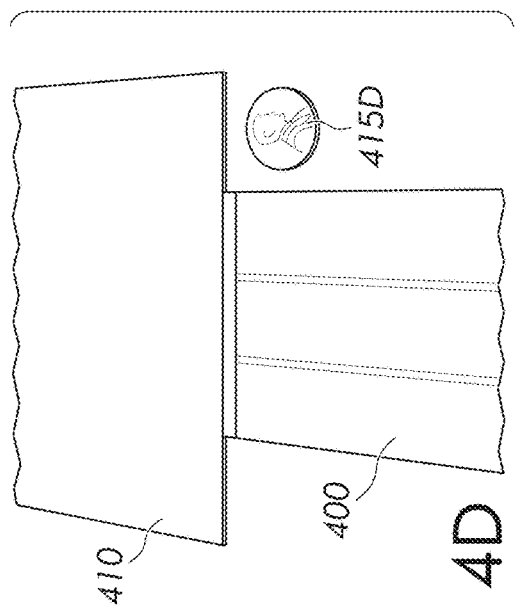
Figure 4C:
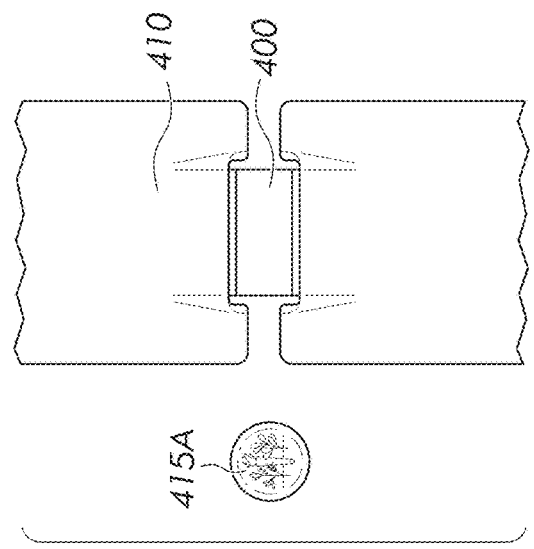
Figure 4D:
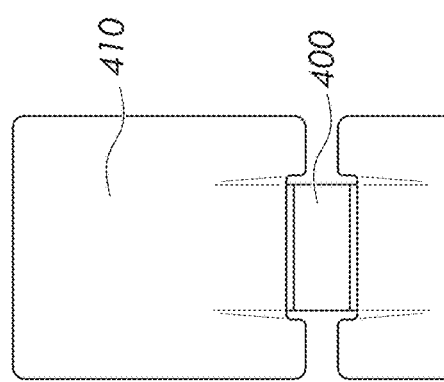

FIGS. 2A and 2B illustrate the results of a construction test involving a reinforced PWB circuit construction material 200. In some embodiments, the reinforced PWB circuit construction material 200 may be constructed by bonding a standard n-layer PWB circuit constructing material with a meta-aramid fiber, such as NOMEX High Temperature Non-Glass Woven Fabric manufactured by DuPont and/or a para-aramid fiber, such as Kevlar. Any combination of the meta-aramid and para-aramid may also be used. The standard n-layer PWB circuit construction material may be bonded with any of the NOMEX and KEVLAR fibers as delineated in Appendix A to the U.S. Provisional Application No. 62/421,915, which is incorporated in its entirety by reference. For example, in some embodiments, NOMEX III may be used as the high temperature non-glass woven fabric reinforcement. Some other examples of NOMEX high temperature non-glass woven fabrics are delineated in FIG. 2C.

Other fabrics, such as Desert Tan Flight Suit Fabric (SKU 08202075-01654) manufactured by Burlington with the following composition: 93% Nomex® Aramid 5% Kevlar® and 2% Antistatic fiber, that incorporate high temperature non-glass woven fabric may also be used as the reinforcement. Any meta-aramid, para-aramid, or any combination thereof may be used as well. In other embodiments, the reinforced PWB circuit construction material 200 may be constructed by bonding a standard n-layer PWB circuit construction material with any other high temperature resistant fabric. The bonding may be done using many standard methods including but not limited to using acrylic and using polyamide no-flow and standard flow prepreg to bond the woven fabric to rigid PWB circuits and then process the combination through extreme heat variations of up to 250° C. for 6 min. Coin 215 is shown for scale. The reinforced PWB circuit construction material 200 may be made using the standard four-layer PWB circuit construction material 100 bonded with a high temperature non-glass woven fabric made of synthetic aromatic polyamide fibers, such as the NOMEX High Temperature Non-Glass Woven Fabric manufactured by DuPont. Any methods of bonding may be used, such as gluing using acrylic adhesives. The reinforced PWB circuit construction material 200, after being held at a one-inch (2.54 cm) radius, when allowed to uncoil in an unrestrained manner, may end up having a 2.7-inch (6.858 cm) radius—double the radius of the standard four-layer PWB circuit construction material 100. Thus, the reinforced PWB circuit construction material 200 may exhibit a spring-back effect unlike the standard four-layer PWB circuit construction material 100. The beginning and ending radii are exemplary and are not exhaustive results of all construction tests. The results of the construction test may vary depending on various factors such as the thickness of the reinforced PWB circuit construction material 200, the temperature of the surroundings, duration for which the reinforced PWB circuit construction material 200 was held in coiled position, etc. The construction test may be conclusive only of the higher spring-back effect of a reinforced PWB circuit construction material 200 compared to a similar standard four-layer PWB circuit construction material 100. The base standard four-layer PWB circuit construction material 100 that is reinforced may be of any thickness and/or have varying thickness at different parts. Accordingly, after reinforcing such a standard PWB circuit construction material 100, the reinforced PWB circuit construction material 200 may also be of any thickness and/or have varying thickness at different parts. In an embodiment, the standard four-layer PWB circuit construction material 100 was 0.195 mils (0.49 millimeters) and the thickness of the reinforced PWB circuit construction material 200 was 0.225 mils (0.65 millimeters). Such a reinforced PWB circuit construction material 200 is needed in various industries such as military and aerospace, oil industry, medical industry, and any other industry where there is a need for PWB circuits that can withstand high temperatures and do not set radially, quickly.

FIGS. 3A and 3B illustrate the results of a die punching test conducted on an exemplary reinforced PWB circuit construction material 300. Coin 315 is shown for scale. The exemplary reinforced PWB circuit construction material 300 was made by bonding both the top side and the bottom side of a standard PWB circuit construction material, such as LFO210 at a bonding temperature of 250° C. (482° F.), with the NOMEX High Temperature Non-Glass Woven Fabric manufactured by DuPont. The reinforced PWB circuit construction material 300 was die punched 310 successfully, using standard manufacturing processes.

FIGS. 4A-4D illustrate the results of a successful fillet replacement testing using an exemplary reinforced PWB circuit construction material 400 such as NOMEX High Temperature Non-Glass Woven Fabric manufactured by DuPont. Coins 415A and 415D are shown for scale. The exemplary reinforced PWB circuit construction material 400 was used at the interface between two or more rigid PWB circuit interface 410 to create a rigid-flexible PWB circuit.

Figure 5B:
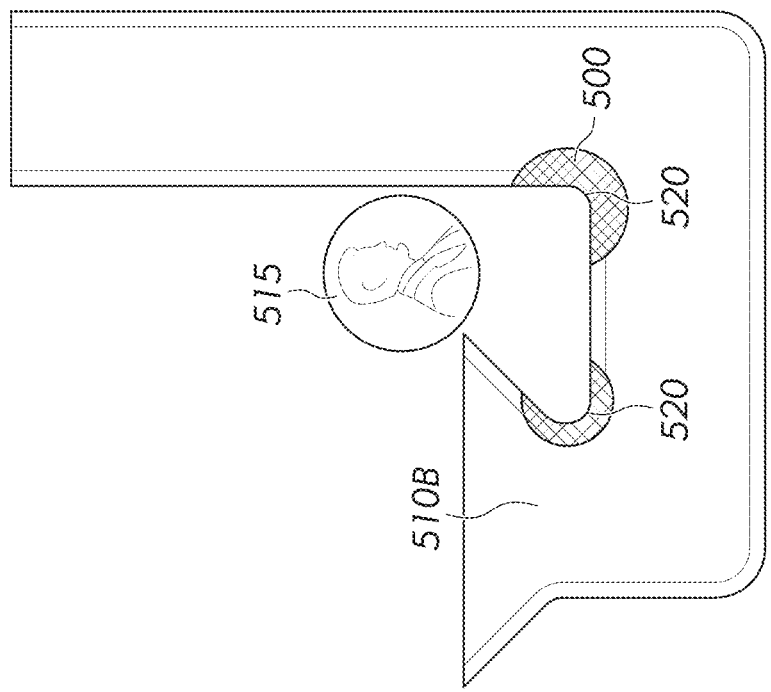
FIG. 5B illustrates a PWB circuit after bonding with a reinforced PWB circuit construction material at the stress points located on the internal grooves of the PWB circuit according to exemplary embodiments of the present invention.
Figure 5A:
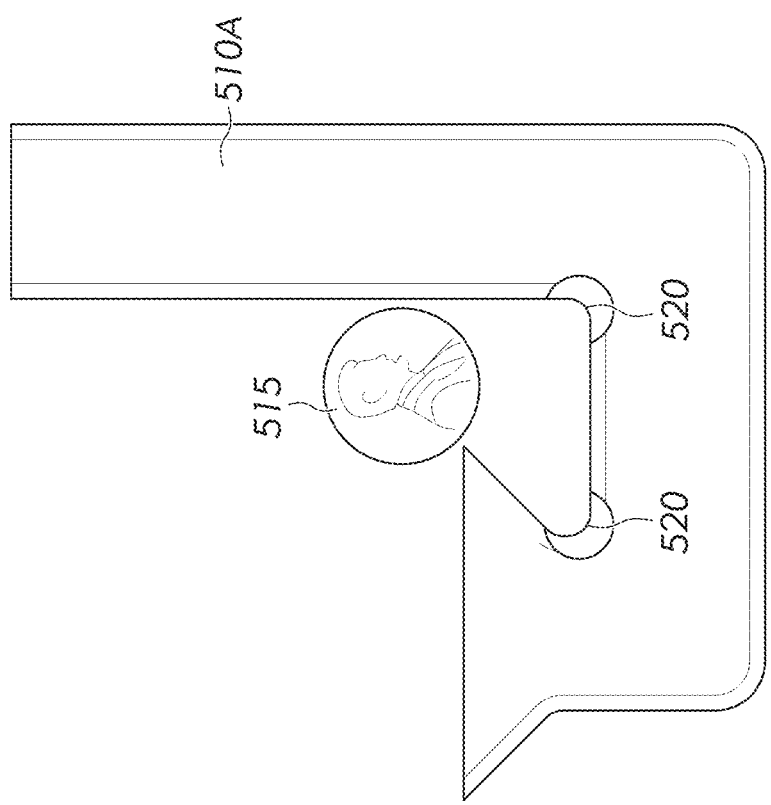
FIG. 5A illustrates a PWB circuit before bonding with a reinforced PWB circuit construction material at the stress points located on the internal grooves of the PWB circuit.

FIG. 5A illustrates an exemplary PWB circuit 510 with an internal radius 520. The internal radius 520 of the PWB circuit 510 is susceptible to tearing at the application of various mechanical forces. FIG. 5B illustrates the successful bonding of an exemplary reinforced PWB circuit construction material 500 to the stress points of a PWB circuit 510 at the internal radius 520. Such bonding results in reducing the stress at the internal radius 520 of the PWB circuit 510 and prevents the internal radius 520 from tearing when subject to various mechanical forces. Coin 515 is shown for scale.

Figure 6:
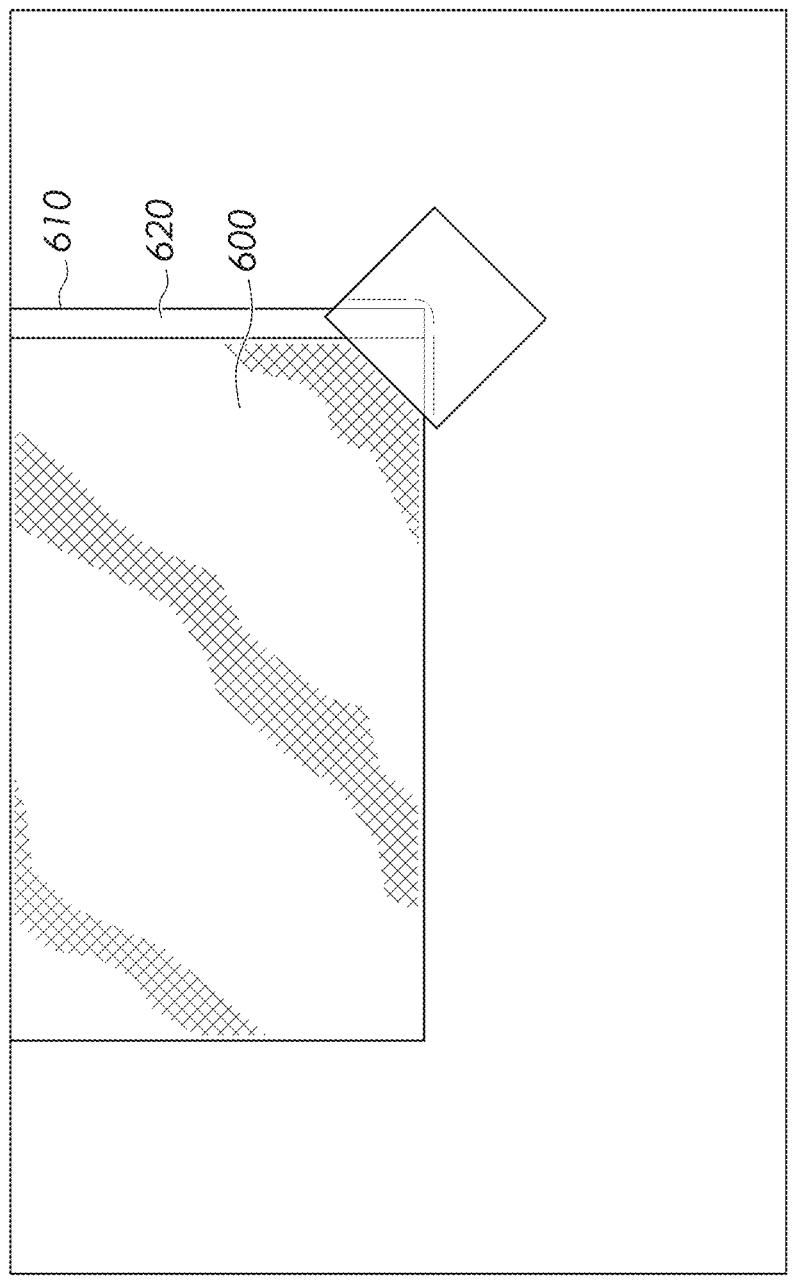
FIG. 6 illustrates a copper clad substrate with one side etched off so that a prepreg polyamide laminate is exposed according to exemplary embodiments of the present invention.

FIG. 6 illustrates an exemplary copper clad substrate 600 with one side 610 etched off so that the prepreg polyamide laminate 620 may be exposed. Even though copper and copper clad cores are the materials of choice for use in rigid-flexible and flexible PWB circuits in the military and aerospace industry, other metals may also be used as the cores. The prepreg 620 may be a two-layer polyamide no-flow glass supported material. The prepreg 620 may also be any other standard prepreg used in the industry. Thermo-shock testing was performed at 448° F. (231° C.) for a ten-second duration on this substrate 600. Any other temperature or time duration for testing may also be used. The thermo-shock test was successful, as no evidence of debonding of the prepreg from the substrate was observed.

Figure 7B:
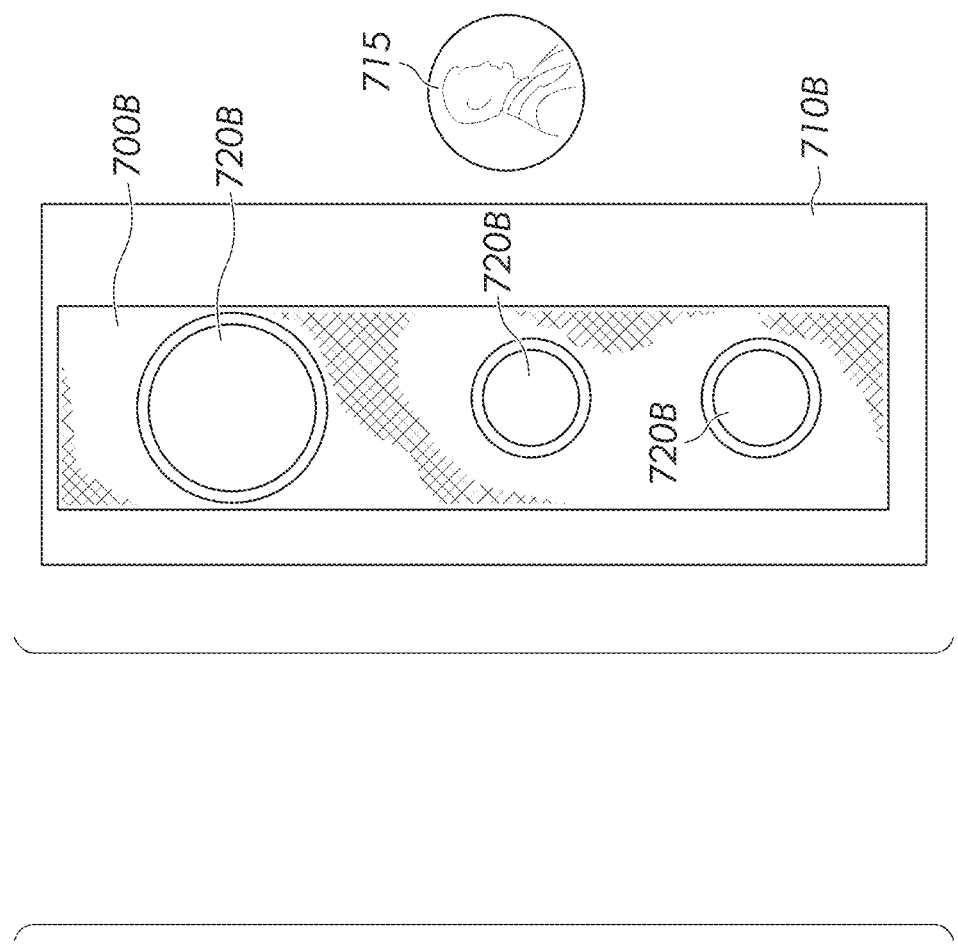
FIGS. 7A and 7B illustrate the results of a connector potting material compatibility testing conducted on a reinforced PWB circuit construction material according to exemplary embodiments of the present invention.
Figure 7A:
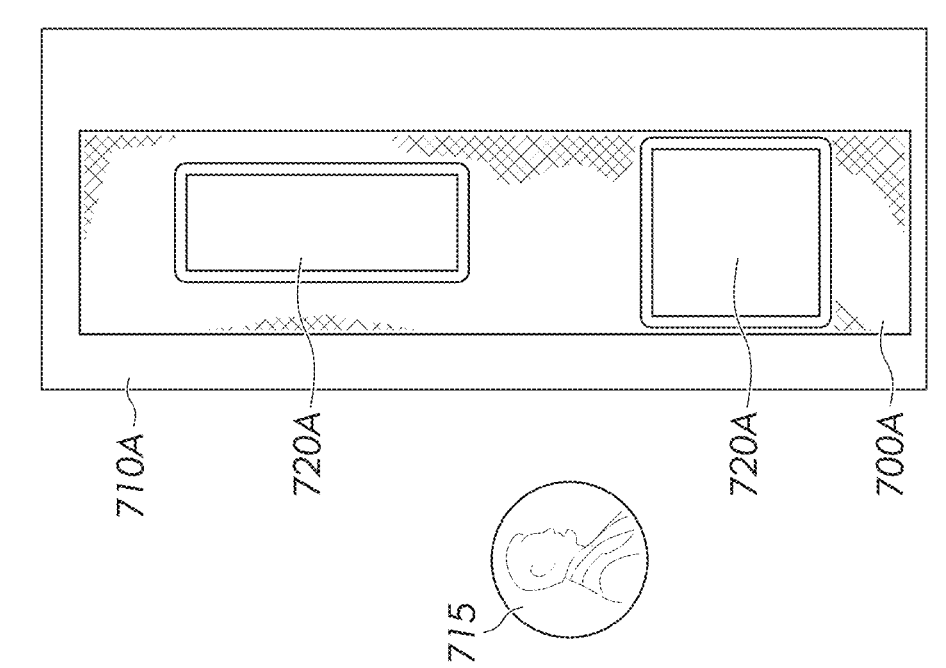

FIGS. 7A and 7B illustrate the results of a connector potting material compatibility testing. FIGS. 7A and 7B illustrate standard solid or gelatinous potting material 720A or 720B that may be used for encapsulating connectors in the military and aerospace industry bonded to the reinforced PWB circuit construction material, such as 700A (FIG. 7A) or 700B (FIG. 7B), which are bonded to the PWB circuit 710A (FIG. 7A) or 710B (FIG. 7B), respectively. Any other kind of potting material may also be used. The test was successful, as no evidence of debonding of the potting material 720A or 720B from the reinforced PWB circuit construction material 700A or 700B was observed after normal manufacturing processes (30-degree dynamic bends). Coin 715 is shown for scale.

Figure 8B:
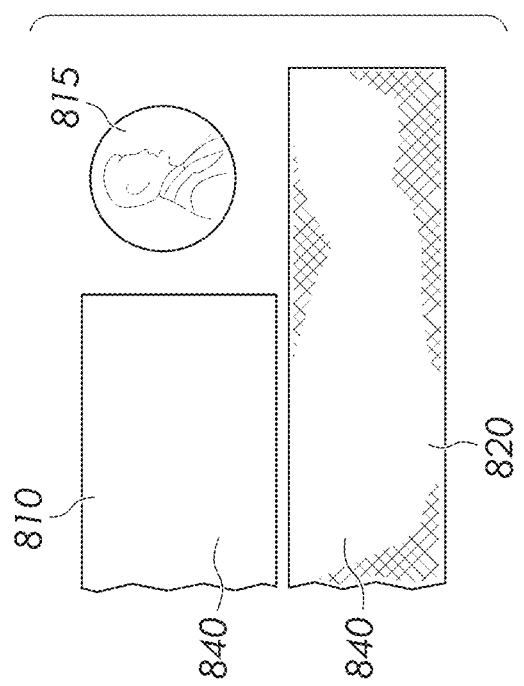
FIG. 8B illustrates a standard four-layer PWB circuit construction material after being bonded with a high temperature non-glass woven fabric with and without a covercoat to create reinforced PWB circuit construction materials according to exemplary embodiments of the present invention.
Figure 8A:
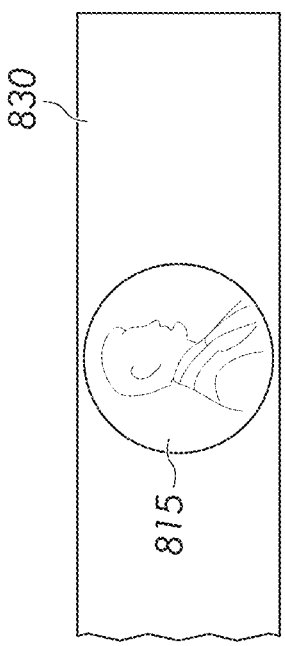
FIG. 8A illustrates a standard four-layer PWB circuit construction material before bonding it with a high temperature non-glass woven fabric with and without a covercoat to create reinforced PWB circuit construction materials.

FIGS. 8A and 8B illustrate the before and after results of bonding the standard four-layer PWB circuit construction material with a high temperature non-glass woven fabric 840, such as one made of synthetic aromatic polyamide fibers, to create reinforced PWB circuit construction materials 810 and 820. This bonding process was done with and without a covercoat 830, as illustrated in FIG. 8A, to the standard four-layer covercoated flexible PWB circuit construction material. FIG. 8B illustrates a reinforced PWB circuit construction material 810 where the bonding may be done on a standard four-layer PWB circuit construction material without the covercoat 830, and reinforced PWB circuit construction material 820 depicts the successful bonding that may be done on a standard four-layer PWB circuit construction material with the covercoat 830. Covercoat 830 may be an adhesive (usually acrylic) coated dielectric (usually polyamide film) that serves as a protective element to protect the rigid-flexible or flexible PWB circuit from the external elements of the environment. Any other kind of covercoats that serve similar functions may be used as well. The covercoat 830 on the flexible circuit may be desirably flame-resistant and moisture impervious, providing protection to the flexible circuit when exposed to a high humidity or high temperature environment. This protects the PWB circuit against the electrical components of the product either igniting or shorting. The covercoat 830 may also be flame-resistant as described in U.S. Pat. No. 7,758,964 incorporated, herein, by reference. Coin 815 is shown for scale.

Figure 9F:
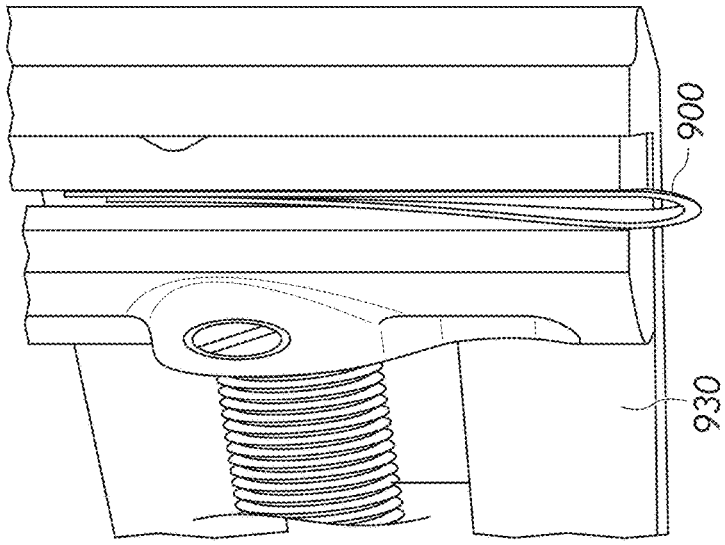
Figure 9E:
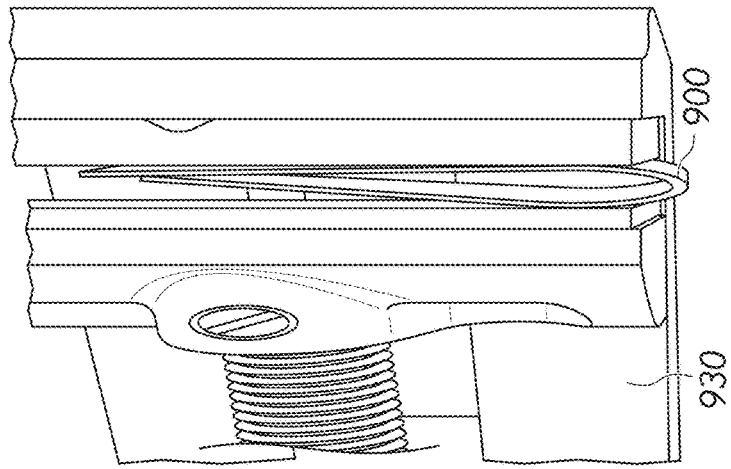
Figure 9D:
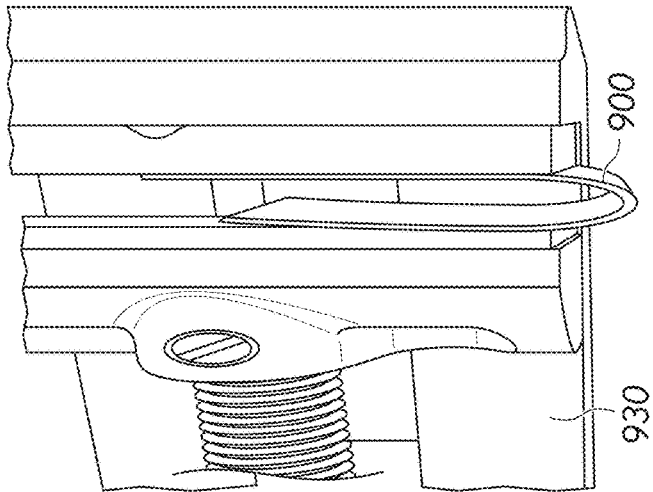
Figure 9I:
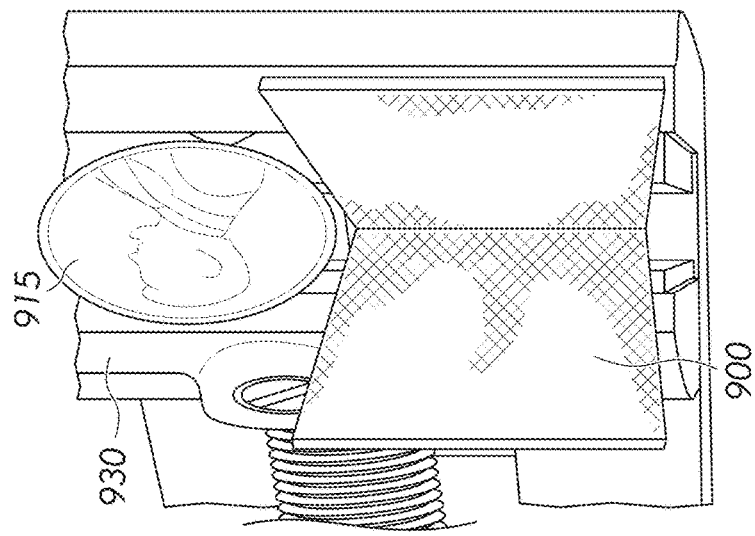
Figure 9H:
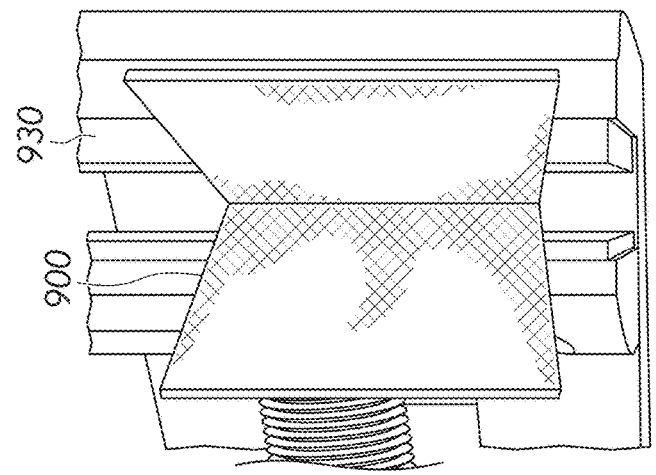
Figure 9G:
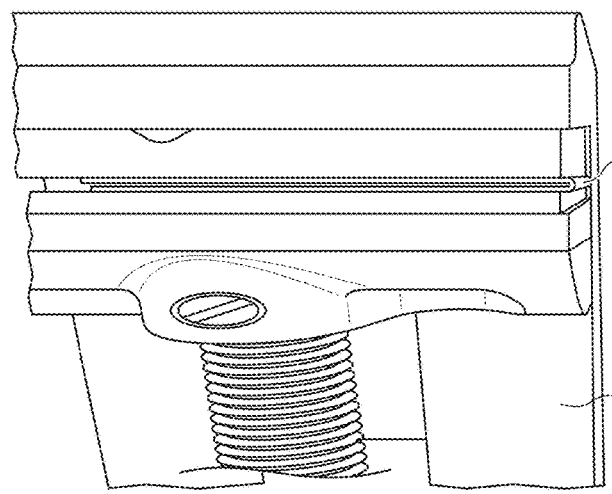

FIGS. 9A-9I illustrate the before and after results of severe compression testing. As illustrated in FIG. 9A, an exemplary standard four-layer PWB circuit construction material was bonded with a high temperature non-glass woven fabric to create a reinforced four-layer PWB circuit construction material 900 that was used for the compression test using a vice 930. Other reinforced n-layer PWB circuit construction materials may also be used for the test. During the severe compression testing using the exemplary reinforced four-layer PWB circuit construction material 900, at the most compressed position the internal bend radius 910 was 0.004 mils (0.0001016 millimeters). FIG. 9B illustrates the post-compression spring-back effect of the reinforced PWB circuit construction material 900 at approximately 90 degrees. FIGS. 9C-9I show further illustrations of the severe compression testing process. The high temperature non-glass woven fabric, when bonded to a standard n-layer PWB circuit construction material, can be used to construct a reinforced flexible PWB circuit, which can then exhibit a much tighter bend radius than a standard flexible PWB circuit. The capacity of a reinforced flexible PWB circuit to exhibit a tighter bend radius also facilitates its use in less-volume applications since it can be compressed more than a standard PWB circuit.

Figure 10A:
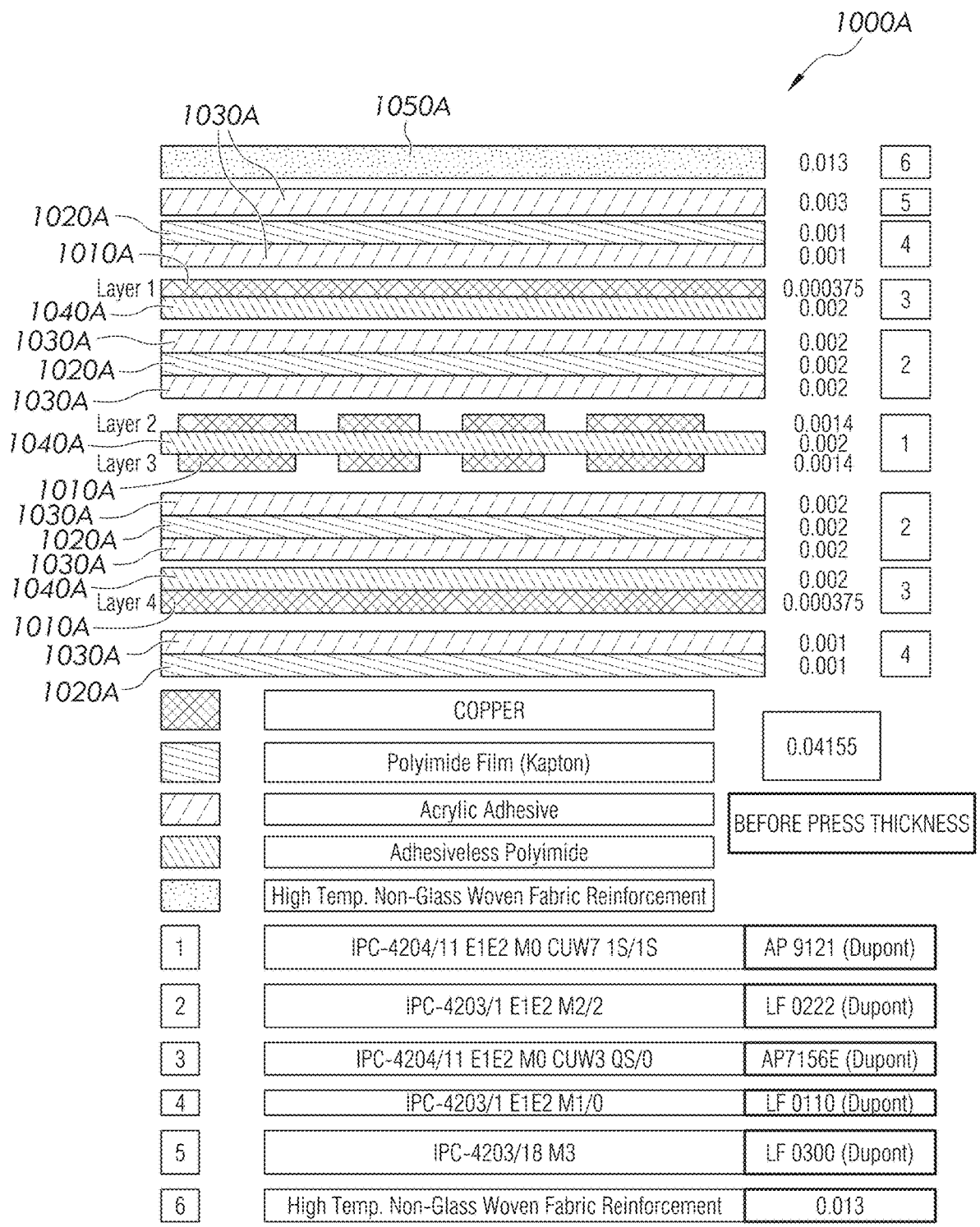
FIGS. 10A and 10B illustrate the material stack up of a reinforced PWB circuit construction material before bonding or lamination according to exemplary embodiments of the present invention.
Figure 10B:
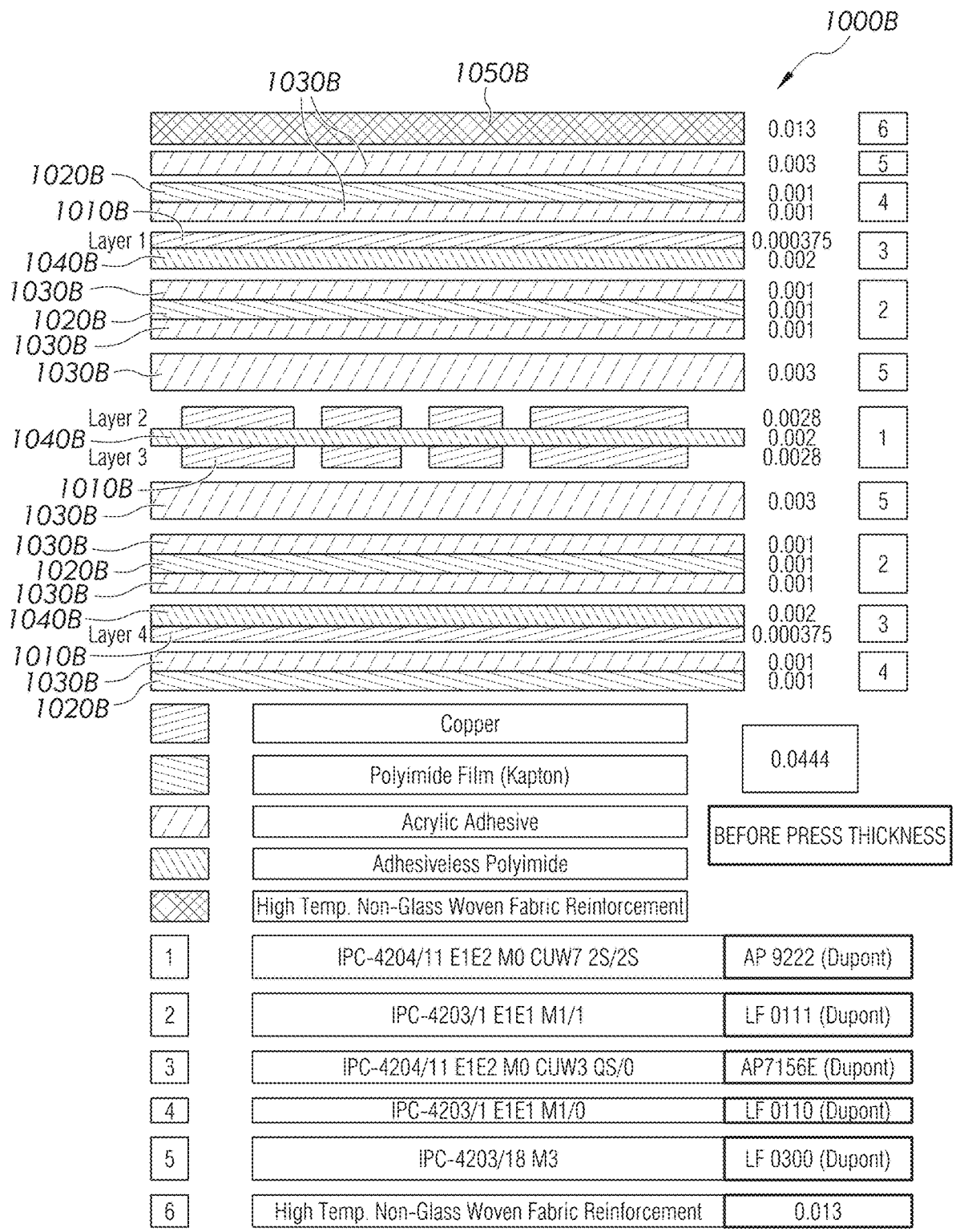

FIGS. 10A and 10B illustrate the material stack up 1000A and 1000B, respectively, of a reinforced PWB circuit construction material. As the FIGS. 10A and 10B illustrate, in an embodiment, the material stack ups may be made using high temperature non-glass woven fabric with other specific materials identified with their respective IPC specifications. Other woven and non-woven fabrics that achieve similar results may also be used. FIG. 10A stack up 1000A is constructed using a 1-ounce copper flexible clad material and FIG. 10B stack up 1000B is constructed using a 2-ounce copper clad material. The "BEFORE PRESS THICKNESS" may indicate the thickness of the materials before they go through the bonding or lamination process. In these illustrated embodiments, the actual finished thickness, after bonding or lamination process, may be approximately 0.004-0.005 mils thinner than the "BEFORE PRESS THICKNESS." The exemplary reinforced PWB circuit constructions shown in FIGS. 10A and 10B are made up of four layers, which are made up of copper 1010A, 1010B; a polyamide film 1020A, 1020B; acrylic adhesive 1030A, 1030B; adhesiveless polyamide 1040A, 1040B; and high temperature non-glass woven fabric 1050A, 1050B. Other similar materials with similar properties may be used in place of each of the materials to create a similar stack up. These materials may be stacked up together using a binding agent. Any kind of bonding agent maybe used, such as glue, acrylic adhesive, etc. Although FIGS. 10A and 10B illustrate an exemplary order of stack up, the order may be different as well. FIGS. 10A and 10B show the cancellation of memory within the internal radius of the material stack up when material stack up is tightly wound and subsequently allowed to unwind without any restraining force. As explained above in FIGS. 2A and 2B, the four-layer reinforced PWB circuit construction material of FIGS. 10A and 10B were also subject to the construction test at room temperature. The four-layer reinforced PWB circuit construction materials may be wound into a tight radial coil. When the coil is released, a memory set may be observed. A memory set may be a measure of the spring-back effect of the PWB circuit construction material. Currently, the standard PWB circuit construction materials depict a high memory set and consequently, a low spring-back effect. As explained above, there is a need for PWB circuit construction materials with lower memory sets and higher spring-back effect—a need satisfied by the reinforced PWB circuit construction materials. During the construction test, when the reinforced four-layer PWB circuit construction materials were relaxed, they held a radial set configuration larger than the tightly wound radius. Compared to similar standard PWB circuit construction materials, the four-layer reinforced PWB circuit construction materials' memory set may be reduced by over 50%. In addition, as shown in FIGS. 9A-9I, the reinforced PWB circuit construction material 900 allows for a much tighter bend radius without jeopardizing the copper or polyamide film construction. Without the high temperature non-glass woven fabric, a standard PWB circuit construction material absorbs the heat into the copper substrate during high temperature applications. The heat induces stress within the substrate and damages it. When a standard PWB circuit construction material is reinforced with a high temperature non-glass woven fabric, it absorbs the Coefficient of Thermal Expansion ("CTE") difference between itself and the copper polyamide substructure to which the high temperature non-glass woven fabric is bonded. Accordingly, the stress induced on the substrate is eliminated or reduced drastically, thereby preventing the substrate from being damaged.

Figure 11A:
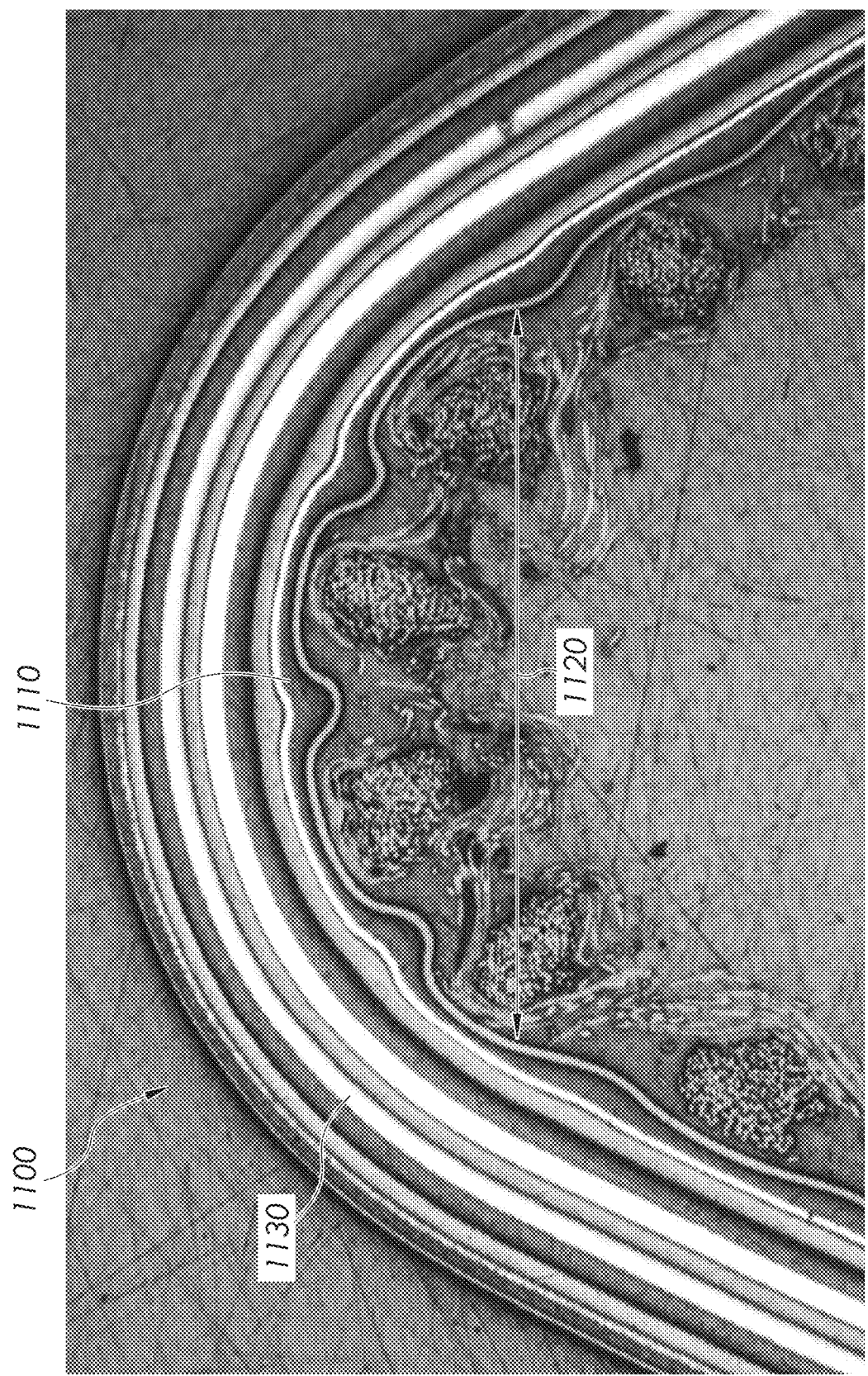
FIGS. 11A-11C illustrate the cross-sectional on analysis of a reinforced PWB circuit construction material, which was subject to a severe compression test, Destructive Physical Analysis ("DPA"), and crushed to a tight internal bend radius according to exemplary embodiments of the present invention.
Figure 11B:
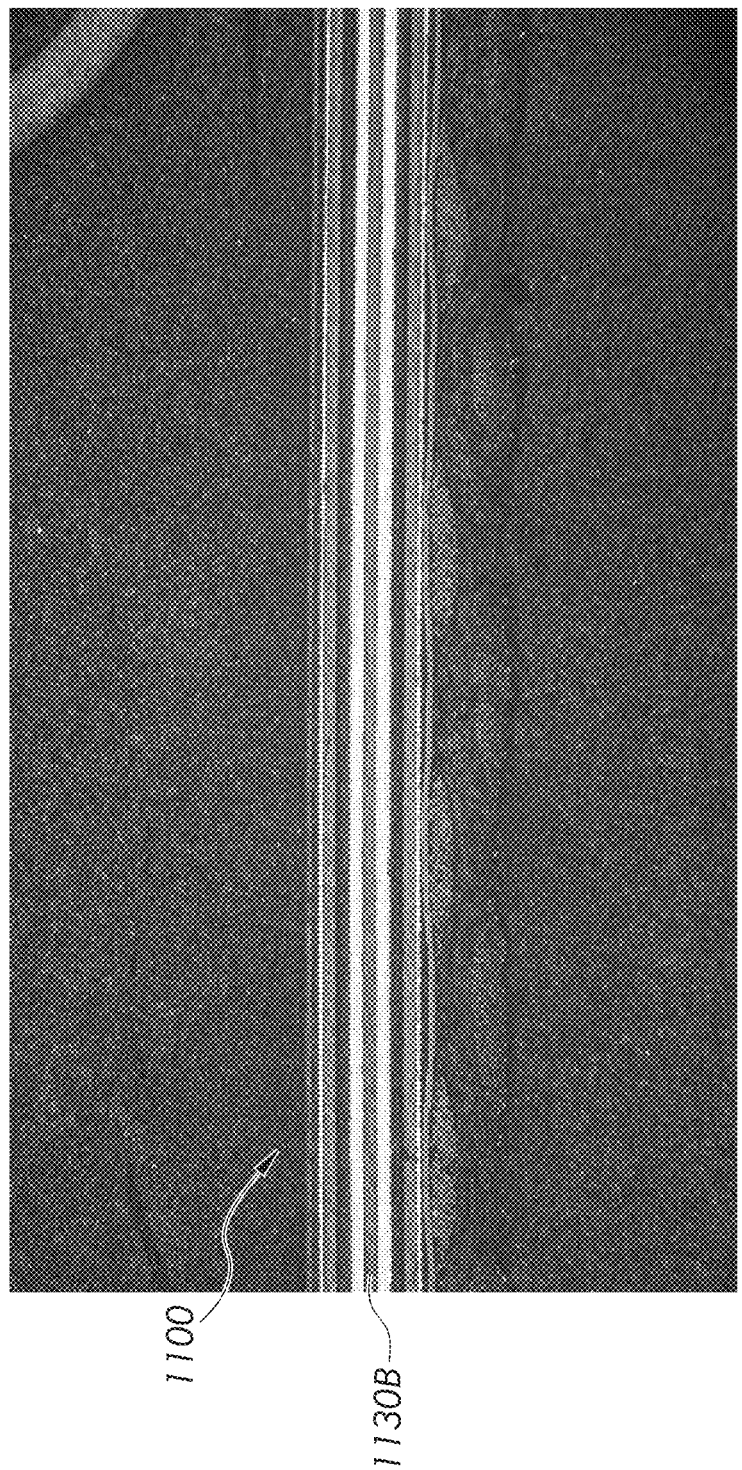
Figure 11C:
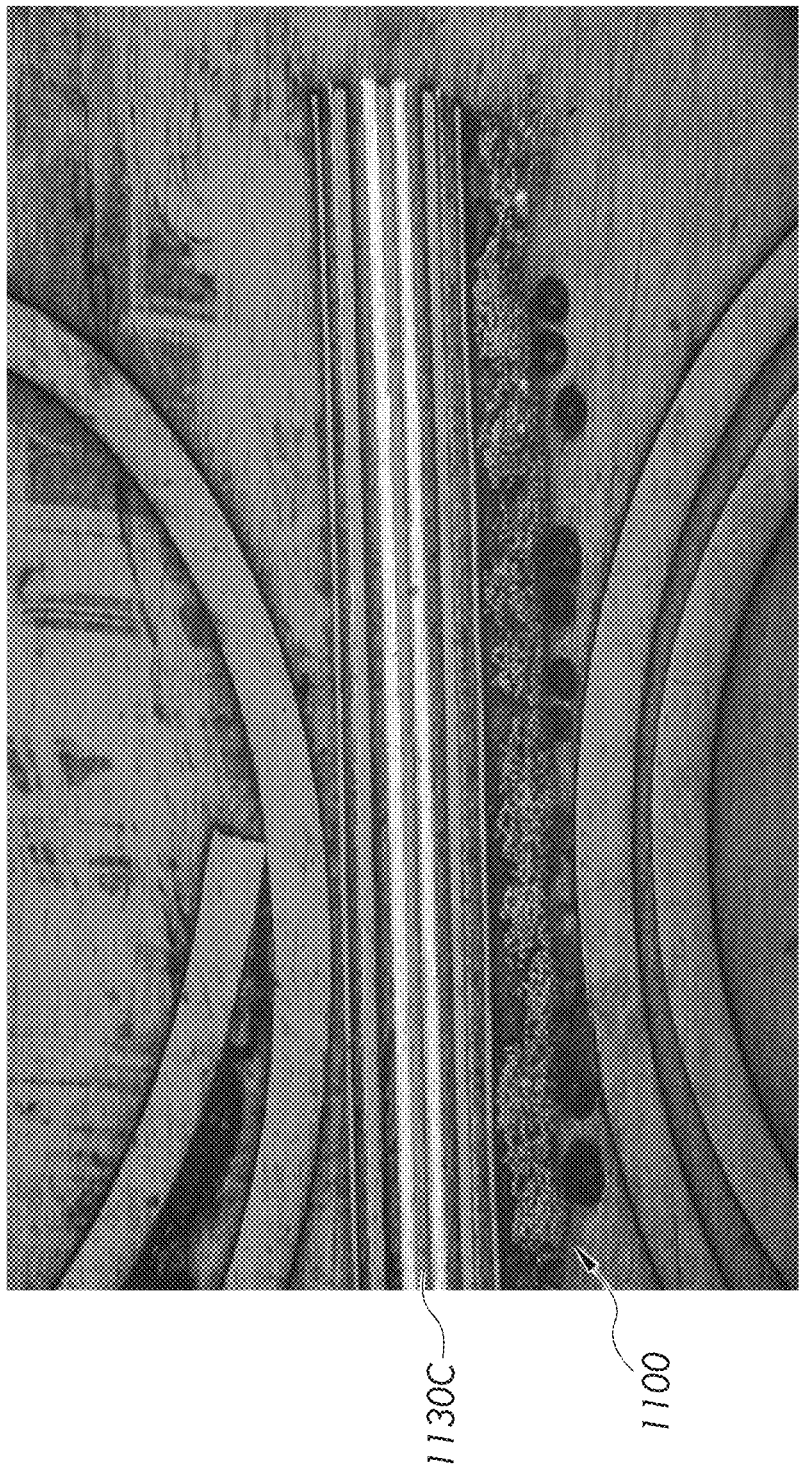

FIGS. 11A-11E illustrate the cross-section analysis of a reinforced PWB circuit construction material 1100, 1100D, and 1100E. As illustrated in FIGS. 11A-11C, the reinforced PWB circuit constructing material 1100 was subject to severe compression, Destructive Physical Analysis ("DPA"), and crushed to an internal bend radius 1010 of approximately 0.006 mils (0.0001524 millimeters), and then micro-sectioned in a static condition (not held in place). As illustrated, the cross-sections 1130A, 1130B, and 1130C showed no evidence of delamination or copper cracking. The expansion 1120 indicates the spring-out effect of the reinforced PWB circuit construction material 1100. Prior to the cross-sectional analysis, a standard PWB circuit construction material with one-ounce double sided copper substrate may be reinforced using DuPont material AP 9111, like the one illustrated in FIG. 10A. The standard PWB circuit construction material was shielded on both sides with a quarter ounce coverlay, LF 0110, made by DuPont, which is a polyamide film that is bonded on to the copper using acrylic adhesives. Other coverlays, as illustrated in Appendix B attached to U.S. Provisional Application No 62/421,915, which is incorporated by reference herein, may also be used. Then, the standard PWB circuit construction material was bonded with a high temperature non-glass woven fabric, 0.013 mils thick, on one of the outer layers using LF0300 acrylic. Bonding may also be achieved by any other method. Different bonding methods may be used for different layers. The reinforced PWB circuit construction material 1100 may then be one of the subjects of a thermal resilience test. In the test, two tests reinforced PWB circuit construction materials may be used. The first test reinforced PWB circuit construction material 1100 may be preconditioned at 250° F. for four hours. Then, the reinforced PWB circuit construction material 1100 may be processed through Pioneer Circuit's Surface Mount Technology ("SMT") manufacturing soldering production line. The temperature used in the process may be 240° C. for six minutes. The second test reinforced PWB circuit construction material may be preconditioned at 250° F. for six hours and subject to Pioneer Circuit's standard solder leveling process at 250° C. for 10 seconds. Subsequently, both the test reinforced PWB circuit construction materials may be viewed under a zoom microscope at 7× power. The visual inspection showed no defects on either specimen. Then, DPA may be performed on both tests specimens. No delamination was observed in the four-layer construction of either of the reinforced PWB circuit construction materials. The photo micrographs of the sections after the DPA are shown at 400× magnification in FIGS. 11A-11C. In summary, it was observed and confirmed that the high temperature non-glass woven fabric when bonded to a polyamide multilayer sub-structure had two primary positive effects. Firstly, as explained above, the high temperature non-glass woven fabric compensates for the differences in CTE between the materials, which in turn reduces the Z-axis pull—a fact that causes delamination of the substructure. Secondly, since high temperature non-glass woven fabric is heat resistant, it also acts as a shield protecting the acrylic bonding material from separating in the X and Y directions.

Another issue that was solved by the reinforced PWB circuit construction material 1100 was the cracking of the copper foil. The copper foil typically used in flexible clad laminate used in the rigid-flexible PWB circuits is susceptible to work hardening that results in the cracking of the copper foil. This in turn can cause electrical opens at the final assembly. This work hardening, or cracking of the copper foil is typically seen when the copper laminate structure is bent multiple times in a sharp radius. Accordingly, to test for copper cracking in PWB circuits built with reinforced PWB circuit construction materials, two four-layer flexible strips were manually bent at a right angle and cycled 360°. One of the two strips, was reinforced with the high temperature non-glass woven fabric using acrylic on one side of the internal radius bend and the other specimen was not reinforced. The specimen without the high temperature non-glass woven fabric had visible signs of broken and/or cracked covercoat and exposed cracked copper underneath the subsurface. Moreover, the non-reinforced PWB circuit construction material only lasted 24 bend cycles before the copper failed due to work hardening. On the other hand, the reinforced PWB circuit construction material 1100 showed no signs of work hardening or failure even after 100 bend cycles. In summary, it was observed and confirmed that the reinforced PWB circuit construction material 1100 compresses and absorbs the internal stresses during the 360° bend cycling, thereby, preventing or drastically reducing the typical work hardening induced copper foil cracking.

Figure 11D:
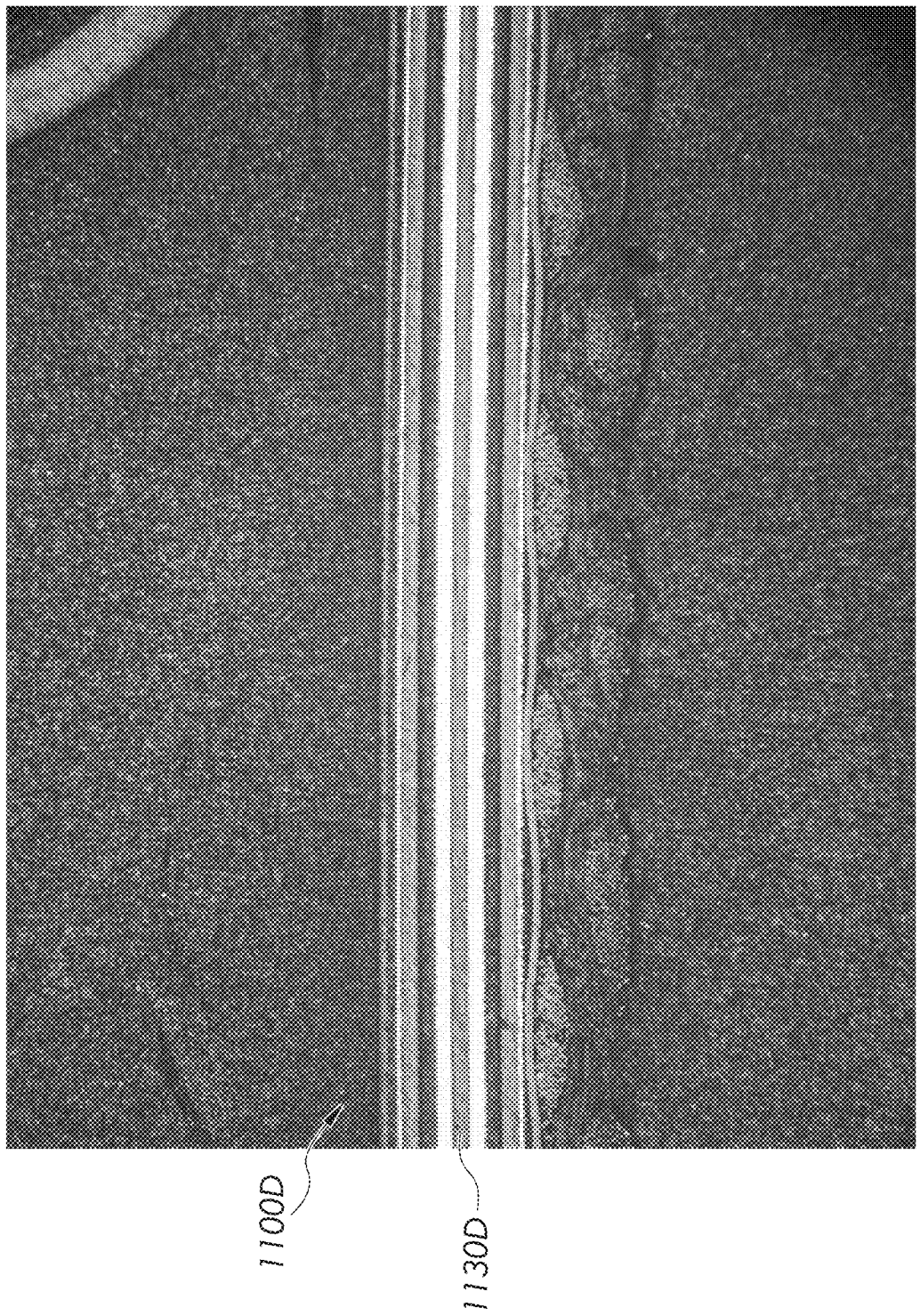
FIG. 11D illustrates the cross-sectional analysis of a reinforced PWB circuit construction material, which was subject to a DPA according to exemplary embodiments of the present invention.

FIG. 11D illustrates the thermal DPA conducted on a test all-flex substrate 1100D made up of polyimide flexible cores 1-ounce double sided rolled annealed copper (center double sided layer) bonded with acrylic to polyimide film to 1 quarter once copper (copper shield on both sides of the structure). This configuration may be the same one (stack up of materials) used on NASA's JPL MER, MSL and Phoenix Lander (Mars Rovers and Landers). In some embodiments, the high temperature woven fabric was bonded to the bottom quarter ounce cover coated, shield as seen above. The test specimen was subject to Pioneer Circuits' SMT line (Surface Mount Technology soldering line). Temperature was 240° C. for 6 minutes. Review was performed using a metallograph at 400 Power. Other temperature, duration, and/or power may be used as well. Upon review, no delamination of the section 1130D within the copper structure was observed. FIG. 11D illustrates a figure approximation of a picture of the sections taken at the same power.

Figure 11E:
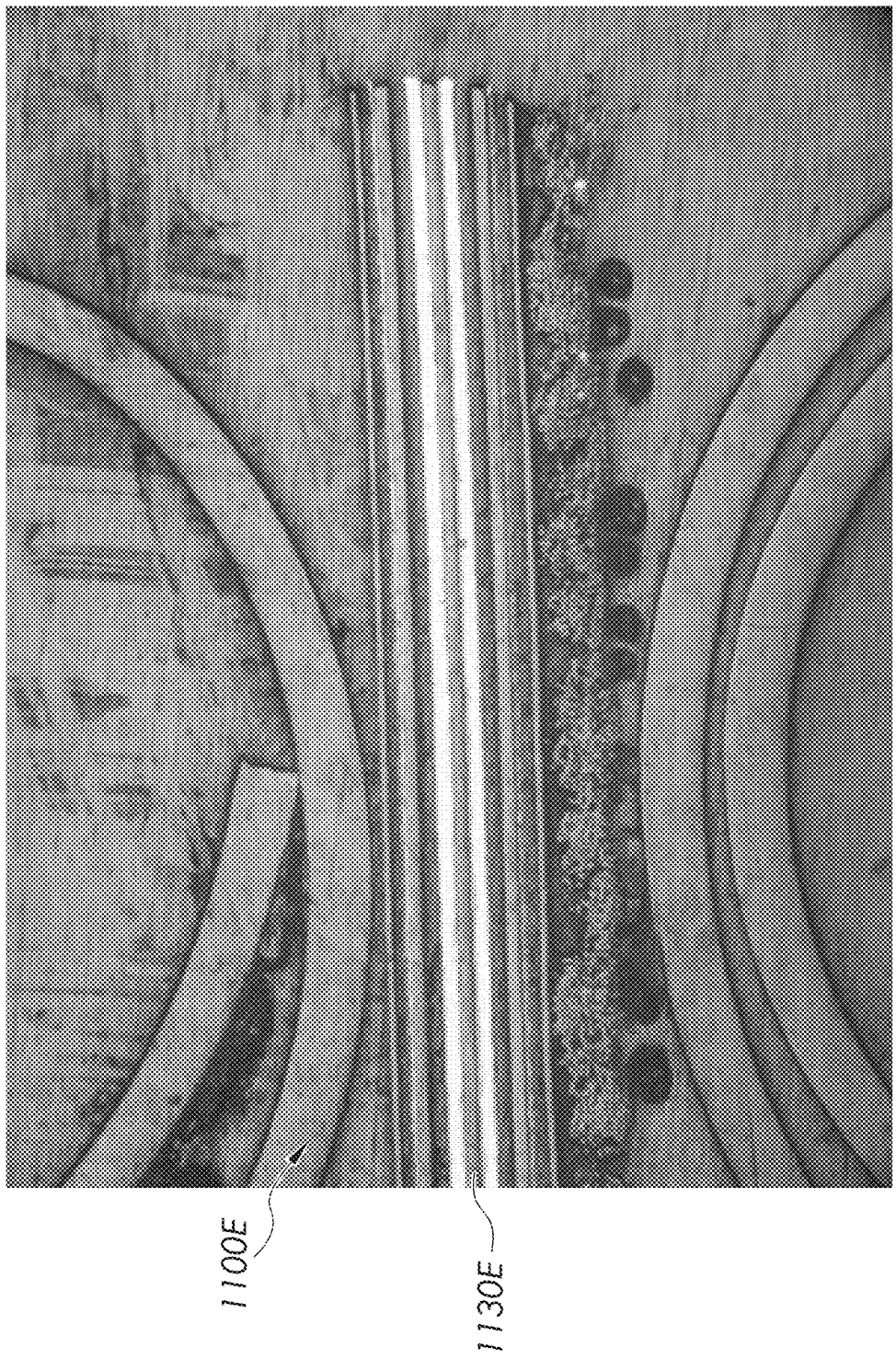
FIG. 11E illustrates the cross-sectional analysis of a reinforced PWB circuit construction material, which was subject to a DPA according to exemplary embodiments of the present invention.

FIG. 11E illustrates a Thermal test DPA conducted on a test all-flex substrate 1100E made up of polyimide flexible cores 1-ounce double sided rolled annealed copper (center double sided layer) bonded with acrylic to polyimide film to 1 quarter once copper (copper shield on both sides of the structure). This configuration is the same one (stack up of materials) used on NASA's JPL MER, MSL and Phoenix Lander (Mars Rovers and Landers). In some embodiments, the high temperature woven fabric may be bonded to the bottom quarter ounce cover coated, shield. This test specimen substrate 1100E may be prebaked at 250° F. for 6 hours (preconditioned) and subjected to Pioneer Circuits' solder leveling/coating process. The solder temperature may be 250° C. for a 5-10 second duration. Review was performed using a metallograph at 400 Power. Other temperature, duration, and/or power may be used as well. Upon review, no delamination of the section 1130E within the copper structure was observed. FIG. 11E illustrates a figure approximation of a picture of the sections taken at the same power.

Other tests that were performed on the reinforced PWB circuit construction material 1000 include thermal stress test, processed compatibility test, and laser cutting to proof out manufacturability. All the tests confirmed the superior characteristics of a reinforced PWB circuit construction material as compared to a similar standard PWB circuit construction material.

The invention claimed is:

1. A reinforced four-layer printed wiring board circuit construction material comprising: an outermost metal substrate layer comprising: a first copper substrate, a polyamide film bonded to an outer surface of the first copper substrate, using a first acrylic adhesive, wherein an inner surface of the first acrylic adhesive directly interfaces with an outer surface of the first copper substrate, and an inner surface of the polyamide film directly interfaces with an outer surface of the first acrylic adhesive, and wherein the printed wiring board circuit construction material is further reinforced with flexible temperature resistant fabric bonded to an outer surface of the polyamide film using a second acrylic adhesive wherein an inner surface of the flexible temperature resistant fabric directly interfaces with an outer surface of the second acrylic adhesive, and wherein an inner surface of the second acrylic adhesive directly interfaces with an outer surface of the polyamide film, such that a non-bonded outer surface of the temperature resistant fabric is exposed to an atmosphere causing the flexible temperature resistant fabric to be an outermost sub-layer, a first inner metal substrate layer directly interfacing with an inner surface of the first copper substrate, comprising: a second copper substrate, a second polyamide film bonded to an outer surface of the second copper substrate using a third acrylic adhesive, and a first non-adhesive polyamide bonded to an outer surface of the second polyamide film using a fourth acrylic adhesive; a second inner metal substrate layer directly interfacing with an inner surface of the second copper substrate, comprising: a third copper substrate, a second non-adhesive polyamide bonded to an outer surface of the third copper substrate, a third polyamide film bonded to an inner surface of the third copper substrate using a fifth acrylic adhesive, and a third non-adhesive polyamide bonded to an inner surface of the third polyamide film using a sixth acrylic adhesive; and a fourth metal substrate layer directly interfacing with an inner surface of the third copper substrate, comprising: a fourth copper substrate, and a fourth polyamide film bonded to an inner surface of the fourth copper substrate using a seventh acrylic adhesive.

2. The reinforced four-layer printed wiring board circuit construction material of claim 1, wherein the temperature resistant fabric comprises at least one of meta-aramid fibers and para-aramid fibers.

3. The reinforced four-layer printed wiring board circuit construction material of claim 1, wherein the reinforced printed wiring board circuit construction material remains flexible.

* * * * *